United States Patent [19]

Ridder et al.

[11] Patent Number: 4,550,333

[45] Date of Patent: Oct. 29, 1985

[54] LIGHT EMITTING SEMICONDUCTOR MOUNT

[75] Inventors: Robert A. Ridder, Brookdale; Joseph C. Tramontana, San Jose, both of Calif.

[73] Assignee: Xerox Corporation, Stamford, Conn.

[21] Appl. No.: 531,562

[22] Filed: Sep. 13, 1983

[51] Int. Cl.[4] .......................... H01S 3/19; H01L 33/00
[52] U.S. Cl. ........................................ 357/81; 357/84; 372/36
[58] Field of Search ................ 357/81, 74, 84; 372/36

[56] References Cited

U.S. PATENT DOCUMENTS

| | | | |
|---|---|---|---|
| 3,760,175 | 9/1973 | Gibson et al. | 372/36 |
| 3,828,228 | 8/1974 | Wong et al. | 357/74 |
| 3,828,229 | 8/1974 | Anazawa | 357/81 |
| 3,840,889 | 10/1974 | O'Brien et al. | 357/81 |
| 3,946,428 | 3/1976 | Anazawa et al. | 357/74 |
| 4,092,614 | 5/1978 | Sakuma et al. | 372/36 |
| 4,107,727 | 8/1978 | Ikezawa et al. | 357/72 |
| 4,131,911 | 12/1978 | Fujine et al. | 357/74 |
| 4,144,504 | 3/1979 | Leggett et al. | 357/81 |
| 4,172,261 | 10/1979 | Tsuzuki et al. | 357/81 |
| 4,255,688 | 3/1981 | Nagasawa | 313/499 |
| 4,270,134 | 5/1981 | Takeda et al. | 357/19 |
| 4,338,577 | 7/1982 | Sato et al. | 372/36 |
| 4,351,051 | 9/1982 | van Alem et al. | 372/36 |
| 4,366,492 | 12/1982 | Kitamura | 346/160 |

FOREIGN PATENT DOCUMENTS

| | | |
|---|---|---|
| 3021140 | 1/1981 | Fed. Rep. of Germany . |
| 52-3391 | 11/1977 | Japan ................ 372/36 |
| 0000159 | 1/1979 | Japan ................ 357/80 |
| 0095388 | 7/1980 | Japan ................ 372/36 |
| 0056984 | 4/1982 | Japan ................ 372/36 |
| 0084180 | 5/1982 | Japan ................ 357/81 |

OTHER PUBLICATIONS

Dufft, Wilm. H. and Camlibel, I., *A Hermetically Encapsulated AlGaAs Laser Diode*, Conference Proceedings of the 30th Electronic Components Conference, San Francisco, CA, (4/1980), pp. 261-269.

Hitachi Laser Diode Application Manual, Jun. 1979, pp. 25 and 26.

*Primary Examiner*—James W. Davie
*Assistant Examiner*—Vangelis Economou
*Attorney, Agent, or Firm*—W. Douglas Carothers, Jr.

[57] ABSTRACT

A light emitting semiconductor mount comprising a metal heat sink support having a top surface partitioned into three steps comprising an upper step, a central step and a lower step. A light emitting semiconductor device is mounted on the central step and a dielectric block mounted in the lower step. The dielectric block has a top surface with two steps, a lower step, positioned adjacent to the central step, and an upper step. A metal film is deposited on the block top surface. The metal film may extend down one side surface of the block to form a contact pad for a power source connection. Means are provided for electrically coupling one terminal of the light emitting semiconductor device to the block lower step. The other terminal of the light emitting semiconductor device comprises the heat sink support per se. The improvement in the mount comprises a flat bar having one end secured to the surface of the block upper step and the other end thereof secured to the surface of the heat sink support upper step. The length and width of the bar are substantially the same as the respective width and depth of the metal heat sink support. The bar may be comprised of metal or dielectric. If a dielectric bar is chosen, then one end of the bar is provided with a metal film on its flat surfaces with electrical continuity provided between the metalized end surfaces at the one bar end and then, this one end is secured to the surface of the block upper step while the other end thereof is secured to the surface of the support upper step. Alternatively, both ends of the dielectric bar may be provided with a metal film on its flat surfaces with electrical continuity between the metalized end surfaces at each bar end. Transparent window plates may be secured to opposite sides of the mount to provide a hermetically sealed cavity in the mount in the region between the bar and the support central step.

10 Claims, 8 Drawing Figures

LIGHT EMITTING SEMICONDUCTOR MOUNT

BACKGROUND OF THE INVENTION

This invention relates to light emitting semiconductor mounts for supporting and protecting light emitting semiconductor devices, e.g., semiconductor injection lasers and light emitting diodes, for their useful operation.

There are known in the art many schemes and examples for supporting light emitting devices providing for their accurate alignment and heat sinking. Examples of such mounts are shown in U.S. Pat. Nos. 3,840,889; 4,144,504; 4,351,051 and 4,366,492 and Japanese Publication No. 52-3391 published Nov. 1, 1977. All these mounts involve a number of different components, including their proper fitting and alignment, making these mounts costly and time consuming in their fabrication and adjustment.

A simpler design for a light emitting semiconductor device known in the prior art is shown in FIG. 1. The mount 10 comprises a copper heat sink 12 having a top portion comprising three steps 14, 16 and 18 providing three separate surfaces of different elevation. The central surface 16 has mounted thereon via, e.g., indium, a light emitting semiconductor device in the form of injection laser 20. The lower step 18 has mounted thereon an insulating block 22 with a stair step 24 on its top surface, which surface includes a deposited metal film 26. Block 22 is secured in step 18 by means of a conventional epoxy type adhesive. The top portion of step 24 has connection terminal 28 secured to the metal film 26 by means of conventional solder or fusion welding.

The laser 20 has its metalized contact 21 electrically connected to metal film 26 of block 22 by means of the fine wire 30, wire 30 being respectively soldered to metalization 21 and metal film 24. The heat sink and mount support 12 provides per se one terminal connection to laser 20 while the other is provided by the terminal 28 via metal film 26 and fine wire 30.

While mount 10 provides a relatively simple structure compared to other mounts, such as those in the above-mentioned patents and publication, it does not lend itself to (i) protecting the light emitting semiconductor device and leads to the device during handling of the mount, (ii) hermetically sealing, or (iii) allow for automated testing without potential damage to the light emitting semiconductor device or leads to such a mounted device.

SUMMARY OF THE INVENTION

According to this invention, a light emitting semiconductor mount provides an improved and useful structure over the prior art mount through the provision of a flat metal or dielectric bar or strip that overcovers and thereby protects the light emitting semiconductor mounted on the heat sink support of the mount from potential damage and also protects its fine lead-in wires from potential damage due to handling. In one embodiment, the bar is dielectric and has one end provided with a metal film on its flat end surfaces with electrical continuity provided therebetween. The metalized end is secured to the top surface of the dielectric block while the other end is secured to the top step of the heat sink support. Alternatively, both ends of the dielectric bar are provided with a metal film on its flat surfaces adjacent the ends thereof with electrical continuity provided between the metalized surfaces at each end of the dielectric bar. Either arrangement provides for overcover protection for the light emitting semiconductor device mounted on the central step of the heat sink support including its delicate lead-in wires. Furthermore, these configurations allow for human handling without concern for damaging the lead-in wires or damaging of the light emitting semiconductor chip mounted on the support central step.

Further, the design allows for automated testing of the supported light emitting semiconductor device without fear of damage from automated testing probes that make contact with the metalized ends of the dielectric bar as the mount unit is sequentially passed through an automated testing station.

Also, electrical contact connection is easily accomplished by using solder bumps on one or both ends of the dielectric bar rather than having both connects made directly to the heat sink support. Lastly, the employment of the dielectric bar in the manner hereinafter to be described lends the mount to be hermetically sealed in a convenient manner previously not realized.

In an alternative embodiment, the mount is designed to provide electrical lead-in connection to both a light emitting semiconductor device and a photodetector mounted on the support central step of the mount. In this embodiment, the dielectric bar is provided without metal end surfaces.

In a further embodiment, the light emitting semiconductor device is mounted on a modified mount to provide useful utility of more than one emission output obtainable from the device.

Further advantages, objects and attainments together with a fuller understanding of the invention will be apparent and appreciated by referring to the following description and claims taken in conjunction with the accompanying drawings.

DESCRIPTION OF THE PREFERRED EMBODIMENTS

Figure 1:
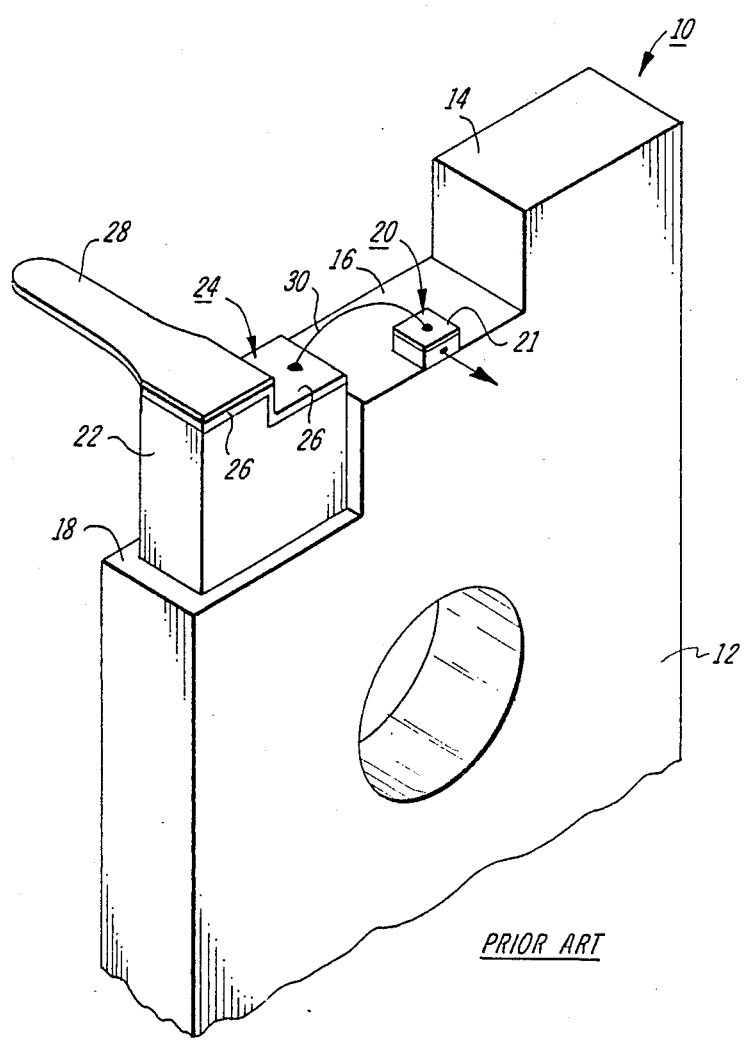
FIG. 1 is a perspective view of a light emitting semiconductor mount of the prior art.
Figure 2:
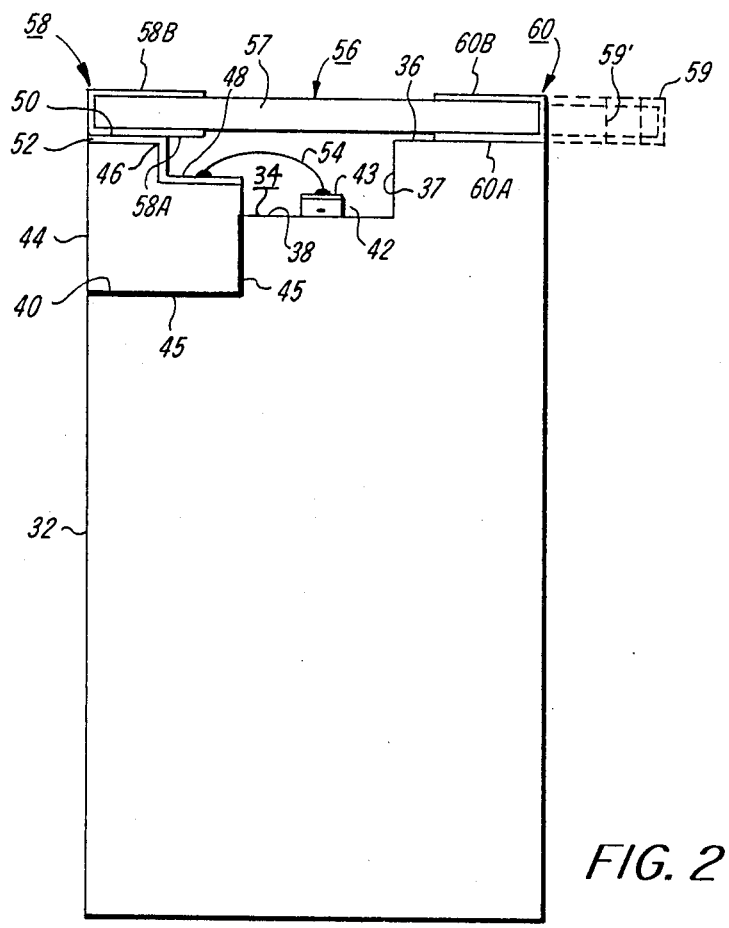
FIG. 2 is a side view of the light emitting semiconductor mount comprising one embodiment of this invention.
Figure 3:
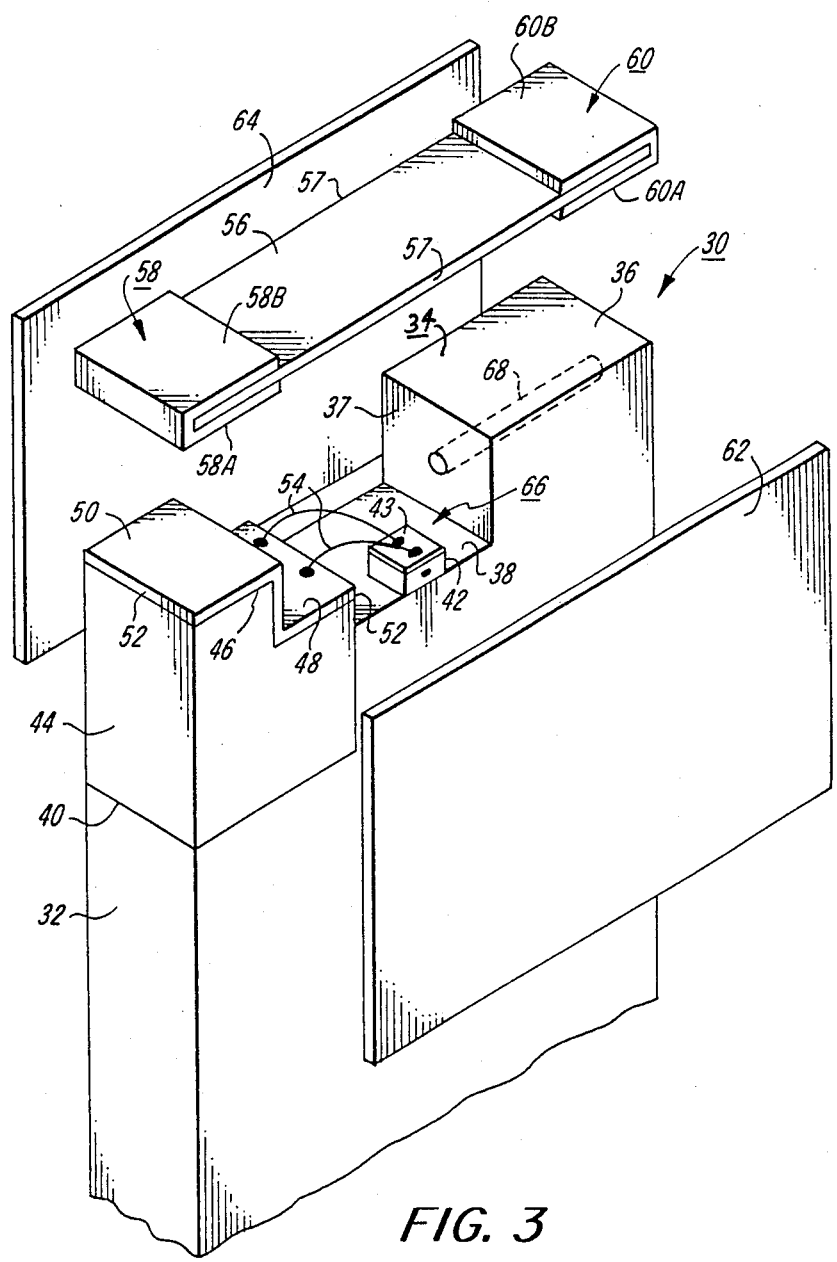
FIG. 3 is a perspective exploded view of the light semiconductor mount shown in FIG. 2.

Referring now to FIGS. 2 and 3, there is shown the mount 30 of this invention. Mount 30 comprises a heat sink support 32 comprising, for example, copper, Kovar or brass, and having a top surface 34 partitioned into three levels forming an upper step 36, a central step 38 and a lower step 40. The central step 38 is the surface where the light emitting semiconductor device 42 is mounted. Device 42 may, for example, be a heterostructure injection laser, heterostructure quantum well laser or a light emitting diode. Device 42 is cemented to the surface of step 38 by means of pure indium heated to 160° C. to provide a bond to the surface of step 38. The surface of step 38 is preferably prepared by being polished by high speed milling. This treatment provides for a flat surface with no more than about a 2 $\mu$m variation in the surface.

The mounting of device 42 to support 32 is accomplished by means of indium or other mounting conductive material. Support 32, therefore, is one of the terminal connections to a power source (not shown) for device 42. This includes upper support step 36 as will be evident in later discussion.

A dielectric block 44 is secured in the lower step 40 by means of a conventional adhesive, for example, an epoxy type adhesive indicated at 45 in FIG. 2. Block 44 is electrically insulating and may be made of ceramic material. The top surface 46 of block 44 is provided with an inset forming two steps, a lower step 48 and an upper step 50. Surface 46 has deposited thereon a metal film 52 which may, for example, be copper, silver or gold, and film 52 has electrical continuity between the lower and upper steps 48 and 50.

The upper metalized contact 43 of device 42 is electrically connected to the metalized film of lower step 48 by means of a metal braid, or one or more fine metal wires 54. Wires 54 may, for example, may be 0.001 mil or 0.003 mil wires.

As shown in FIGS. 2 and 3, a flat dielectric bar 56 having substantially the same length and width as the width and thickness of the support 32 is mounted on top of support 32. One end of the bar 56 is secured to the metal film 52 of upper step 50 of block 44 while the other end of bar 56 is secured to the surface of upper step 36 of support 32. As shown in FIGS. 2 and 3, both ends of bar 56 may be provided with a metal film 58 and 60 on the respective end surfaces of the bar. The metal film continues around the ends of the bar 56 so that there is electrical continuity between the respective opposite metalized regions 58A and 58B and 60A and 60B of these deposited films. As noted in dotted line form in FIG. 2 at 59, the end of bar 56 may alternatively be extended, including the metal film 60, and include an opening 59' to provide a terminal for an electrical lead to a power source.

The bar 56 may be secured to upper block step 50 and the surface of upper support step 36 by means of conductive epoxy, e.g., silver epoxy or by means of fusion welding. The metal surfaces 58B and 60B form means for terminal connection to a power source to operate device 42. Surfaces 58B and 60B may be provided with solder bumps (not shown) for this purpose.

Alternatively, bar 56 may be composed completely of metal with one end secured to upper block step 50 with conductive silver epoxy adhesive and its other end secured to the upper support step 36 by means of an insulting epoxy adhesive.

With dielectric bar 56 secured in place, the delicate light emitting semiconductor device 42 and its fine lead-in wires 54 are protected by its partial overcover rendering the mount 30 easier to handle without primary concern for damage to the device or it wiring connections. Also, since the two terminals for operation of the device 42 are respectively pads 58B and 60B, mount 30 lends itself to efficient testing in an automatic testing station wherein mounts 30 are consecutively fed into the station and positioned to receive a pair of laterally positionable electrical probes that respectively contact pads 58B and 60B to test the operation of device 42 properly positioned to receive the testing station probes.

Figure 2A:
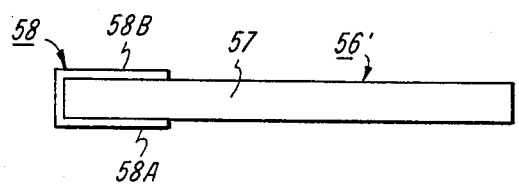
FIG. 2A is another embodiment for the top flat dielectric bar for the mounts shown in FIGS. 2 and 6.

An alternative form for dielectric bar 56 is shown in FIG. 2A. Bar 56' is the same as bar 56 except that one end of bar 56' is not provided with metal film 60. In employing this bar on mount 30, the electrical terminals for connection to device 42 are pad 58A and support 32 per se.

The design of mount 30 is such as to lend itself to easily provide a hermetically sealed environment for device 42. The hermetic sealing arrangement is shown in FIG. 3. After mounting and wiring device 42 and the securing of dielectric bar 56 on upper steps 36 and 50 as previously described, a pair of transparent window plates 62 and 64 are secured to opposite sides of the support 32 by means of a conventional epoxy adhesive, the adhesive being applied along all four edges of each plate. In this manner, plates 62 and 64 are secured along the edges and across the body of support 32 as well as along the opposite edges 57 of the dielectric bar 56. Plates 62 and 64 may be comprised of glass, plastic, quartz or resin.

To hermetically seal the cavity 66 formed by plates 62 and 64, dielectric bar 56, block 44, pillar 37 and support step 38, the cavity 66 is evacuated by means of an aperture provided in support 32 leading to the cavity. In FIG. 3, this aperture is shown at 68 leading from a side edge of support 32 to side surface of pillar 37. Upon evacuation of cavity 66, the aperture 68 is sealed at its other end with hermetical seal to preserve the evacuated integrity of cavity 66.

Figure 4:
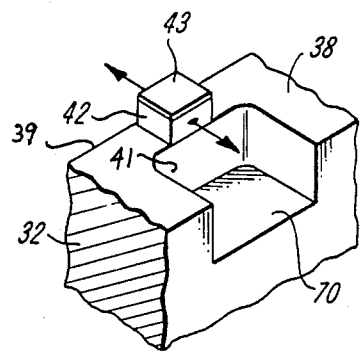
FIG. 4 is a partial perspective view of an alteration to the support central step of the mount shown in FIG. 3.

If light emitting semiconductor device has more than one light emitting surface, such as an injection laser with two oppositely opposed emitting facets, it may be desirable to utilize both outputs. This may be accomplished in mount 30 shown in FIG. 4 by forming a cavity 70 in surface of central step 38 so that both emission surfaces of device 42 are parallel with a respective edge surface 39 and 41 of the central step 38. With a sufficiently wide cavity 70, the chance of unwanted reflection of light from the emission surface shown in FIG. 4 is minimized. The cavity 70, for example, may be about 100 mils deep and about 100 mils wide.

Figure 5:
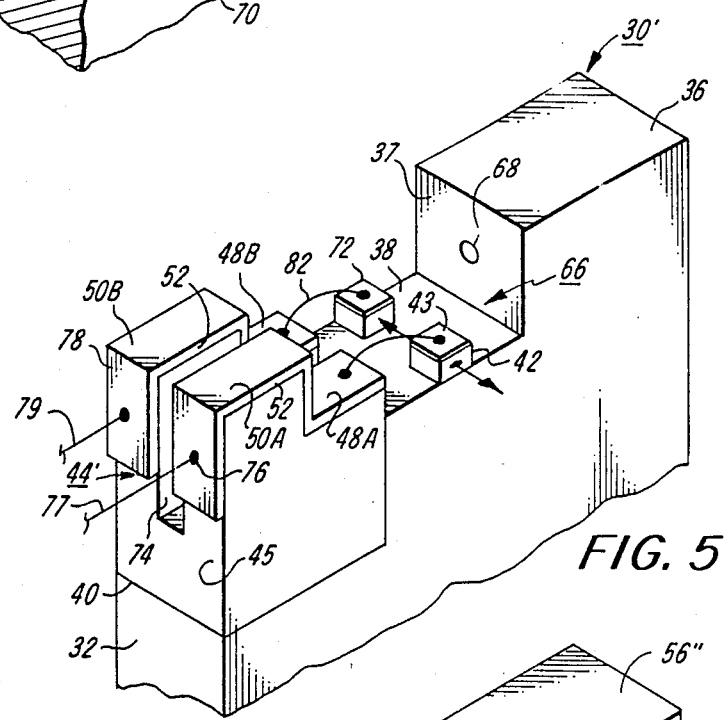
FIG. 5 is a partial perspective view showing a combination light emitting semiconductor device and photodetector arrangement with modified mount structure.
Figure 5A:
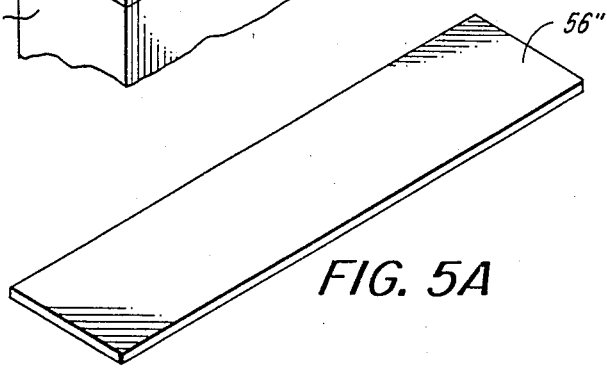
FIG. 5A is another embodiment for the top flat dielectric bar for the mount shown in FIG. 5.

FIG. 5 shows an alternative embodiment comprising mount 30' with modifications to dielectric block 44 and bar 56 when it is desired to employ a photodetector 72 in tandem with the light emitting semiconductor device 42 on the central step 38 of support 32.

As shown in FIG. 5, block 44' has been modified to be bifurcated in its upper portion by means of a cut 74, which may be accomplished, for example, by a diamond saw. Cut 74 renders block 44' with two lower metalized steps 48A and 48B and two upper metalized steps 50A and 50B. The metalized film 52 is deposited, prior to performing this bifurcation on block 44', so as to extend along outer face 45 of the block to form the respective contact pads 76 and 78 for connection to power source leads 77 and 79 by means of solder, e.g., silver solder.

The metal contact surface 43 of light emitting semiconductor device 42 is connected to lower metalized step 48A by means of fine wire 80 while one contact of photodetector 72 is connected to lower metalized step 48B by means of fine wire 82. These connections are made, for example, by thermal compression bonding.

With block 44', photodetector 72, device 42 and wires 80 and 82 secured as illustrated in FIG. 5, flat dielectric bar 56'', having no metallic end regions, is secured to steps 50A, 50B and 36 by means of an insulating epoxy adhesive.

As in the case of the embodiment for mount 30 in FIG. 3, mount 30' may also be hermetically sealed with the use of the transparent window plates 62 and 64 in the manner as previously described. Additionally, the cut 74 must also be filled and sealed with a dielectric hermetically sealing epoxy material.

Figure 6:
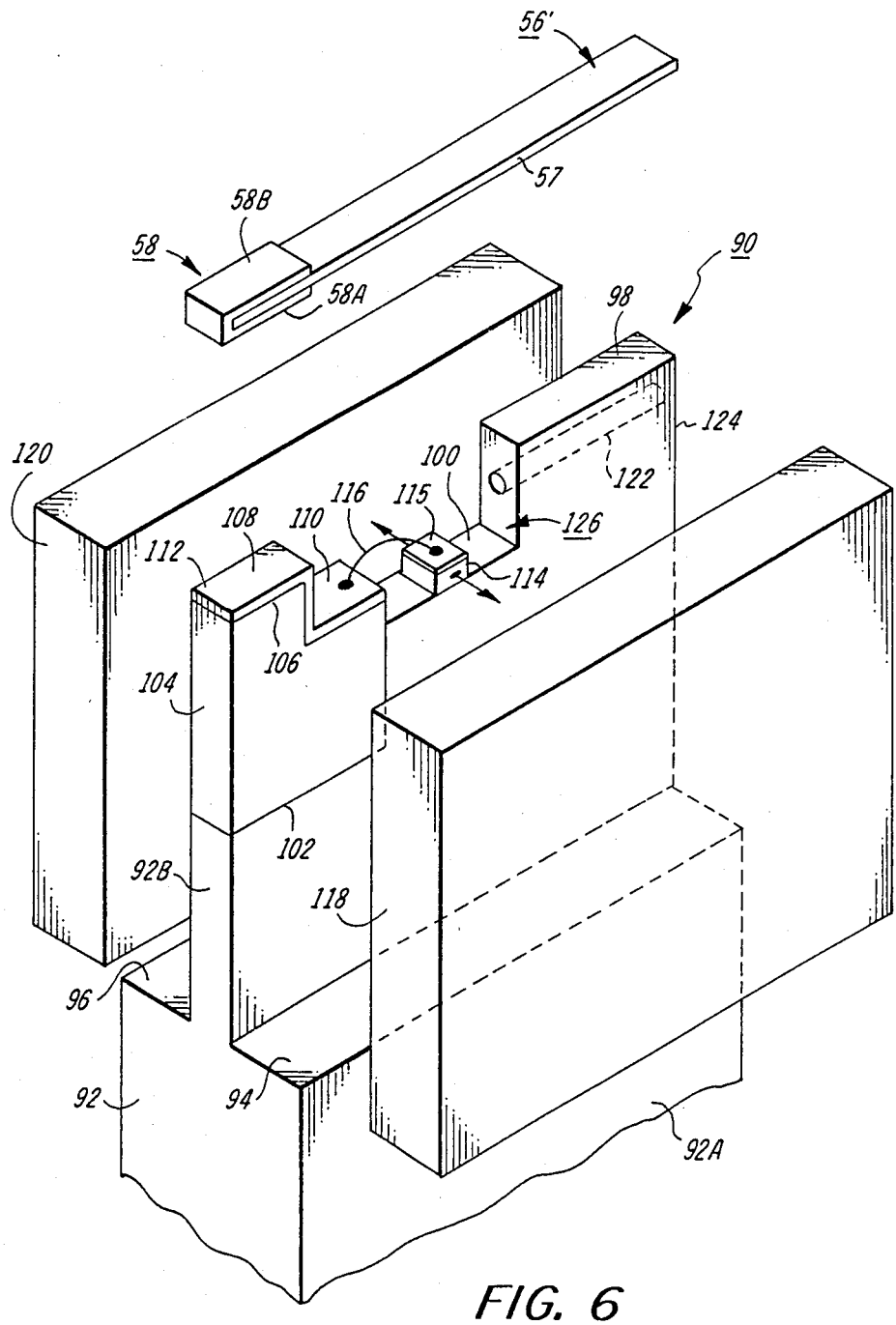
FIG. 6 is a perspective exploded view of another embodiment of the light semiconductor mount of this invention.

FIG. 6 shows a further embodiment of this invention. The mount 90 comprises a heat sink support 92 that has a lower portion 92A relatively thicker than its upper portion 92B forming the respective support steps 94 and 96. Upper portion 92B is provided with three steps, upper step 98, central step 100 and lower step 102. Dielectric block 104 is mounted in lower step 102 by means of an epoxy adhesive. Block 104 has a surface 106 forming upper step 108 and lower step 110. Metal layer 112 is deposited on surface 106 of both steps 108 and 110.

Light emitting semiconductor device 114 is mounted on central step 100 by means of indium and has its metalization contact 115 electrically connected to the metal layer 112 on lower step 110 by means of the fine gold wire 116.

To be noted is that the thickness of portion 92B of support 92 and block 104 is the same as the length of light emitting semiconductor device 114 so that the emission from opposite facets or surfaces of device 114 are unobstructed by the surfaces of step 100 and the structure of mount 90. As an example, the thickness of portion 92B and the length of device 114 may be about 10 mils. The thickness of the steps 94 and 96 may each be about 30 mils.

Shown in FIG. 6, is the flat dielectric bar 56' of FIG. 2A. The width of bar 56' is the same as thickness portion 92B, e.g., 10 mils.

The transparent window plates 118 and 120 are fabricated from material, such as glass, plastic or resin, and have about the same thickness as the steps 94 and 96, i.e. 30 mils. Plates 118 and 120 may be about 100 mils in height. Plates 118 and 120 are mounted respectively on steps 94 and 96 so that their top surfaces will be flush with the top surface of bar 56' after the latter has been attached to block upper step 108 and support upper step 98 with conductive epoxy adhesive in the manner previously explained. Thus, the top edge of the plates 118 and 120 will be secured by epoxy ahesive along the bar edges 57. Aperture 122 in the pillar 124 formed by steps 98 and 100 provides an entry to the cavity 126 formed by bar 56', block 104, step 100 and plates 118 and 120 for purposes of evacuation of the cavity 126 followed by the hermetical sealing of aperture 122.

While the invention has been described in conjunction with specific embodiments, it is evident that alternatives, modifications and variations will be apparent to those skilled in this art in light of the foregoing description. Accordingly, it is intended to embrace all such alternatives, modifications and variations as fall within the spirit and scope of the appended claims.

What is claimed is:

1. A light emitting semiconductor mount comprising a metal heat sink support, said support having a top surface partioned into three steps comprising an upper step, a central step and a lower step, a light emitting semiconductor device mounted on said central step, a dielectric block mounted in said lower step, said block having a top surface with two steps, a lower step adjacent said central step and an upper step, a metal film deposited on said block top surface, means for electrically coupling one terminal of said light emitting semiconductor device to said block lower step, the other terminal of said light emitting semiconductor device comprising said heat sink support, the improvement comprising a dielectric flat bar having one end secured to the surface of said block upper step and the other end thereof secured to the surface of said support upper step, the length and width of said bar being substantially the same as the width and depth of said support, at least one end of said dielectric bar is provided with a metal film on its flat surfaces with electrical continuity provided between said metalized end surfaces at said one bar end, said one bar end being secured to the surface of said block upper step and the other end thereof secured to the surface of said support upper step, said bar providing a shield to prevent potential damage to said device in the handling of said mount while said one bar end functions as a leadout terminal for said device.

2. The light emitting semiconductor mount of claim 1 wherein said deposited metal film on said block top surface extends down along a portion of the outer side surface of said dielectric block.

3. The light emitting semiconductor mount of claim 1 wherein both ends of said dielectric bar are provided with a metal film on its flat surfaces with electrical continuity provided between said metalized end surfaces at each of said bar ends.

4. The light emitting semiconductor mount of claim 1 wherein transparent plates are secured to opposite sides of said mount to provide a hermetically sealed cavity in said mount in the region enclosed by said dielectric bar, said dielectric block, said support upper step and said support central step.

5. The light emitting semiconductor mount of claim 4 wherein there is an aperture provided through said support to said cavity to permit evacuation of said cavity followed by hermetically sealing of said aperture.

6. The light emitting semiconductor mount of claim 5 wherein said aperture is provided through the pillar formed by said central and upper step.

7. The light emitting semiconductor mount of claim 1 wherein said light emitting semiconductor device has two light emitting facets on opposite ends thereof, a portion of the surface of said central step is cut away to provide for unobstructed emission from both of said facets.

8. A light emitting semiconductor mount comprising a metal heat sink support said support having a top surface partioned into three steps comprising an upper step, a central step and a lower step, a light emitting semiconductor device mounted on said central step, a dielectric block mounted in said lower step, said block having a top surface with two steps, a lower step adjacent said central step and an upper step, a metal film deposited on said block top surface, means for electrically coupling one terminal of said light emitting semiconductor device to said block lower step, the other terminal of said light emitting semiconductor device comprising said heat sink support, the improvement comprising a dielectric flat bar having one end secured to the surface of said block upper step and the other end thereof secured to the surface of said support upper step, the length and width of said bar being substantially the same as the width and depth of said support, said bar providing a shield to prevent potential damage to said device in the handling of said mount, said dielectric block bifurcated through its top surface and said metal film to provide separate electrical contacts by means of separation of said block metal film thereby forming first and second adjacent and electrically independent block lower and upper steps, a photodetector mounted on said central surface adjacent to said light emitting semiconductor device and aligned therewith to receive the emission from an emission facet thereof, means for electrically coupling one terminal of said light emitting device to said first block lower step, means for electrically coupling one terminal of said photodetector to said second block lower step, the other terminal of said light emitting semiconductor device and said photodetector comprising said heat sink support.

9. The light emitting semiconductor mount of claim 8 wherein said block metal film extends along the outer surface of said block to form a pair of contact pads due to said bifurcation.

10. The light emitting semiconductor mount of claim 8 wherein transparent plates are secured to opposite sides of said mount and the spacing provided at said block bifurcation is hermetically sealed to provide a hermetically sealed cavity in said mount in the region between said flat dielectric bar and said support central step.

* * * * *